(12) United States Patent
Minotti

(10) Patent No.: US 12,183,707 B2
(45) Date of Patent: Dec. 31, 2024

(54) PACKAGED SEMICONDUCTOR DEVICE HAVING IMPROVED RELIABILITY AND INSPECTIONABILITY AND MANUFACTURING METHOD THEREOF

(71) Applicant: STMICROELECTRONICS S.r.l., Agrate Brianza (IT)

(72) Inventor: Agatino Minotti, Mascalucia (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 129 days.

(21) Appl. No.: 17/472,207

(22) Filed: Sep. 10, 2021

(65) Prior Publication Data
US 2022/0084980 A1 Mar. 17, 2022

(30) Foreign Application Priority Data

Sep. 14, 2020 (IT) .......................... 102020000021679

(51) Int. Cl.
*H01L 23/00* (2006.01)
*H01L 23/538* (2006.01)

(52) U.S. Cl.
CPC .......... *H01L 24/73* (2013.01); *H01L 23/5389* (2013.01); *H01L 24/24* (2013.01); *H01L 24/25* (2013.01); *H01L 24/92* (2013.01); *H01L 24/97* (2013.01); *H01L 24/32* (2013.01); *H01L 2224/24226* (2013.01); *H01L 2224/24247* (2013.01); *H01L 2224/244* (2013.01); *H01L 2224/2501* (2013.01); *H01L 2224/32225* (2013.01); *H01L 2224/73267* (2013.01); *H01L 2224/92244* (2013.01); *H01L 2224/97* (2013.01); *H01L 2924/15153* (2013.01)

(58) Field of Classification Search
CPC ....... H01L 2924/15153; H01L 25/0652; H01L 25/071; H01L 25/112; H01L 25/042; H01L 25/0655; H01L 25/072; H01L 25/0753; H01L 25/115; H01L 23/5389; H01L 23/16–26; H01L 21/782–786; H01L 24/97
See application file for complete search history.

(56) References Cited

U.S. PATENT DOCUMENTS

| | | | |
|---|---|---|---|
| 2006/0214288 A1* | 9/2006 | Ohsumi | H01L 24/82 257/E25.023 |
| 2007/0108585 A1* | 5/2007 | Pavier | H01L 23/3675 257/E23.092 |
| 2009/0065915 A1 | 3/2009 | Lehmann | |

(Continued)

FOREIGN PATENT DOCUMENTS

EP 1 876 642 A1 1/2008

*Primary Examiner* — Nelson Garces
*Assistant Examiner* — Quinton A Brasfield
(74) *Attorney, Agent, or Firm* — Seed IP Law Group LLP

(57) ABSTRACT

Packaged device having a carrying base; an accommodation cavity in the carrying base; a semiconductor die in the accommodation cavity, the semiconductor die having die pads; a protective layer, covering the semiconductor die and the carrying base; first vias in the protective layer, at the die pads; and connection terminals of conductive material. The connection terminals have first connection portions in the first vias, in electrical contact with the die pads, and second connection portions, extending on the protective layer, along a side surface of the packaged device.

20 Claims, 6 Drawing Sheets

(56) References Cited

U.S. PATENT DOCUMENTS

| | | |
|---|---|---|
| 2017/0148746 A1 | 5/2017 | Chiu et al. |
| 2017/0365542 A1* | 12/2017 | Essig ..................... H01L 25/16 |
| 2017/0365543 A1* | 12/2017 | Lee .................. H01L 23/49866 |
| 2018/0315674 A1 | 11/2018 | Chen et al. |
| 2018/0366403 A1* | 12/2018 | Yu ......................... H01L 23/147 |
| 2020/0111732 A1* | 4/2020 | Kanbe ............... H01L 23/49822 |

* cited by examiner

PACKAGED SEMICONDUCTOR DEVICE HAVING IMPROVED RELIABILITY AND INSPECTIONABILITY AND MANUFACTURING METHOD THEREOF

BACKGROUND

Technical Field

The present disclosure relates to a packaged semiconductor device having improved reliability and inspectionability and the manufacturing method thereof.

Description of the Related Art

It is known to enclose semiconductor devices comprising a single die or a plurality of reciprocally coupled dice in a housing or package of insulating material, typically of resin or composite material. These packages may be configured differently, according to the intended type of mounting. Furthermore, in case the device is designed to work at high voltage and/or current, these packages usually comprise structures capable of dissipating heat on one or more sides.

BRIEF SUMMARY

The present disclosure provides a package which overcomes the drawbacks of the prior art.

According to the present disclosure, a packaged electronic device and the manufacturing method thereof are provided.

In at least one embodiment, a packaged device includes a front surface, a back surface opposite to the front surface, and a side surface extending between the front surface and the back surface; a carrying base; an accommodation cavity in the carrying base; a semiconductor die in the accommodation cavity, the semiconductor die having die pads; a protective layer, covering the semiconductor die and the carrying base; first vias in the protective layer, at the die pads; and connection terminals of conductive material, the connection terminals having first connection portions in the first vias, in electrical contact with the die pads, and second connection portions, extending on the protective layer, along the side surface of the packaged device; a support having conductive contact regions facing the first connection portions of the connection terminals; and adhesive regions between the conductive contact regions and the front surface of the device, in electrical contact with the connection terminals, the adhesive regions further extending along the side surface of the packaged device, in contact with the second connection portions, of the connection terminals.

BRIEF DESCRIPTION OF THE SEVERAL VIEWS OF THE DRAWINGS

For a better understanding of the present disclosure, embodiments thereof are now described, purely by way of non-limiting example, with reference to the accompanying drawings, wherein.

DETAILED DESCRIPTION

Hereinafter, reference will be made to packages providing dual side cooling, for surface mounting, having input/output (I/O) pads arranged on the bottom side of the device.

For example, US 2017/0148746 (U.S. Pat. No. 10,083,888) describes different surface mounting package structures, designed to reduce the risk of die/dice breakdown during lamination of the housing material. In these known package structures, a conductive base, typically of metal, has a cavity accommodating a die and a protective layer passed by conductive vias.

A package structure of the type described in the aforementioned patent may be formed, for example, using the process shown in FIGS. 1-10 and described hereinafter.

Figure 1:
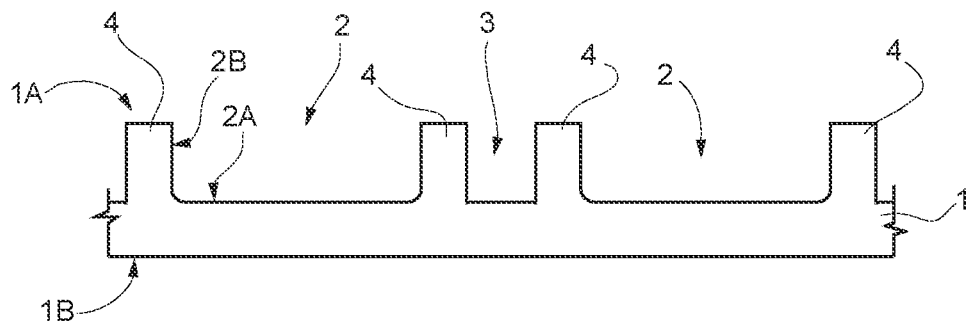
FIGS. 1-10 are cross-sections of a comparative example device during successive packaging steps.

FIG. 1 shows a conductive base 1 of metal, such as copper or other metal or metal alloy, having a top surface 1A and a bottom surface 1B.

The top surface 1A is shaped and has a plurality of accommodation cavities 2, surrounded by a separation cavity 3. The accommodation cavities 2 may have a substantially parallelepiped shape, with a bottom surface 2A connected to side walls 2B. The side walls 2B are defined by projections 4 of the conductive base 1.

The conductive base 1 may be formed, for example, from a metal band, processed to remove the metal in the cavities 2 and 3.

Figure 2:
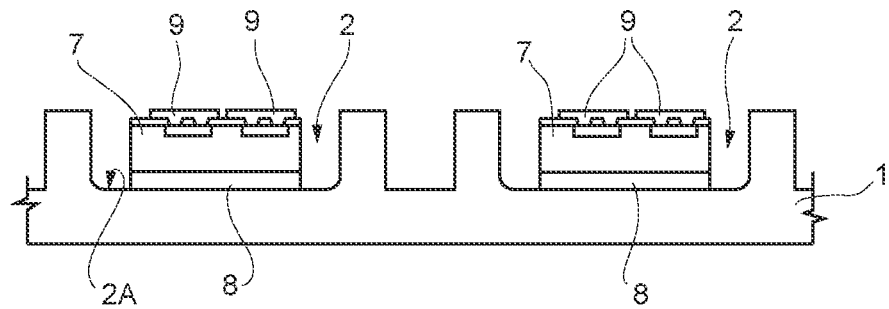

With reference to FIG. 2, dice 7 are bonded to the accommodation cavities 2 through conductive adhesive regions 8, for example of a conductive gel or an epoxy layer.

The dice 7 may integrate single power components or integrated circuits including power components, processing components and electrical connections, schematically shown in the figures and connected to the outside by pads 9 arranged on the front side of the dice 7.

The dice 7 are bonded to the bottom surface 2A of the respective accommodation cavity 2 on their back side.

Figure 3:
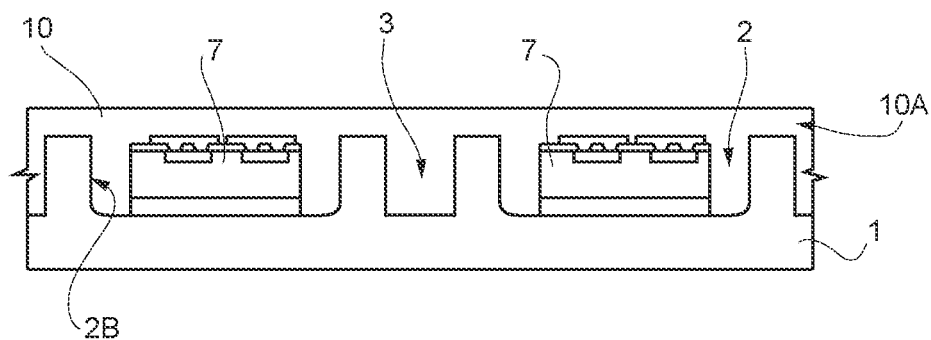

Subsequently, FIG. 3, a protective layer 10 is deposited on the conductive base 1 and on the dice 7, for example using a lamination technique. The protective layer 10 is, for example, of polyamide (so-called prepeg). The protective layer 10 is deposited in a fluid state so as to penetrate into the accommodation cavities 2, between the side walls 2B and the dice 7, as well as within the separation cavity 3, and completely covers the dice 7 with a portion 10A extending above the accommodation cavities 2A.

Figure 4:
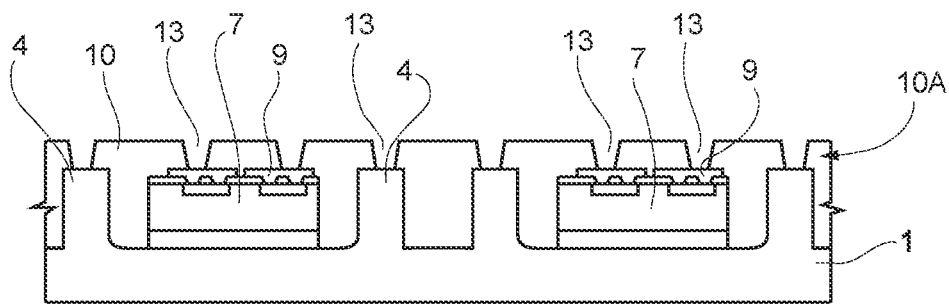

In FIG. 4, vias 13 are formed in the protective layer 10, for example by laser drill, possibly after covering the protective layer 10 through a thin anti-reflective layer (not shown), for example of copper. The vias 13 extend for the entire thickness of the portion 10A of the protective layer 10 up to the pads 9 which are thus exposed. Furthermore, the vias 13 are also formed on the projections 4.

Figure 5:
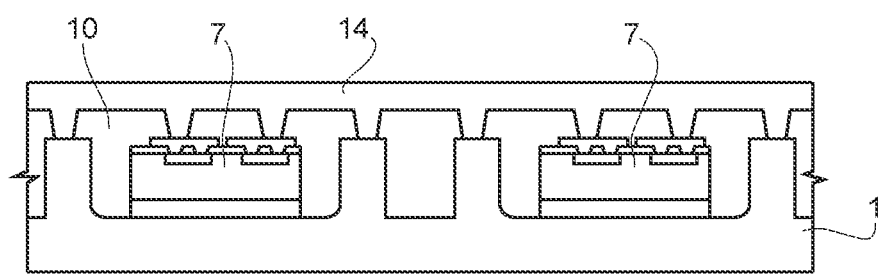

In FIG. 5, a conductive layer 14 is formed on the protective layer 10 and fills the vias 13. The conductive layer 14 may be of copper or an alloy thereof.

Figure 6:
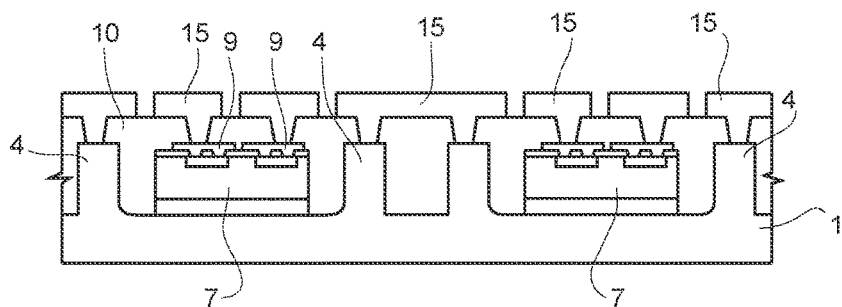

In FIG. 6, the conductive layer 14 is patterned, for example by etching, to form connection regions 15, each in electrical contact with a respective pad 9 or with the respective projection 4 of the conductive base 1.

Figure 7:
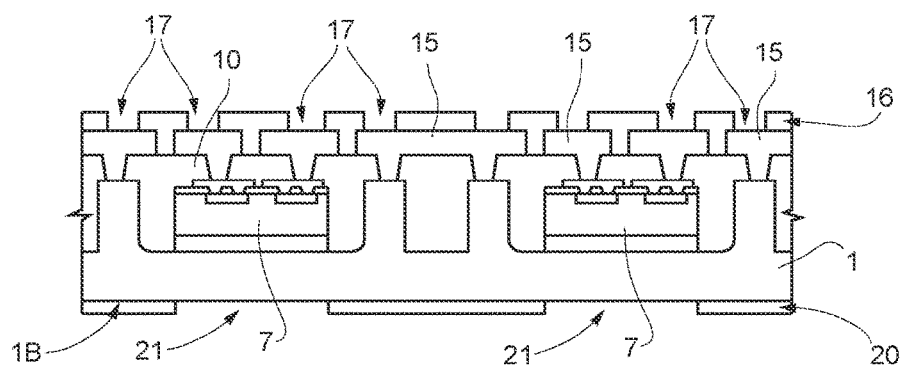

In FIG. 7, a first insulating layer 16, for example an insulating alloy or solder, is formed and shaped above and between the connection regions 15. The first insulating layer 16 has first openings 17 at the connection regions 15.

Furthermore, a second insulating layer 20 is formed and shaped on the bottom surface 1B of the conductive base 1. The second insulating layer 20 has second openings 21, for example one for each die 7, underlying the respective die 7.

Figure 8:
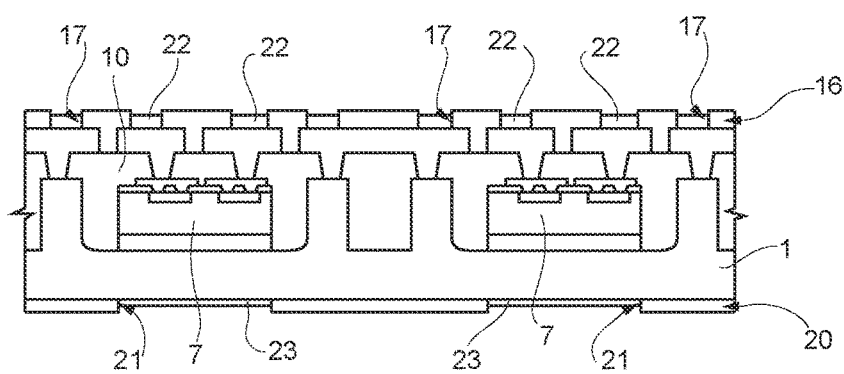

In FIG. 8, top outer pads 22 are formed in the first openings 17 of the first insulating layer 16 and bottom outer pads 23 are formed in the second openings 21 on the bottom surface 1B of the conductive base 1. The outer pads 22 and 23 are of electrically conductive material and are formed, for example, through an ENIG (Electroless Nickel Immersion Gold) process, that is by galvanic nickel growth and formation of a thin gold layer obtained by immersion, to improve the possibility of soldering and the non-oxidability.

The connection regions 15 and the top outer pads 22 form top terminals of the device; the bottom outer pads 23 form bottom terminals as well as thermal dissipation surfaces of the devices (not yet separated).

In a not-shown manner, connection elements, such as solder balls, not shown, may be formed on the outer pads 22 and 23.

Figure 9:
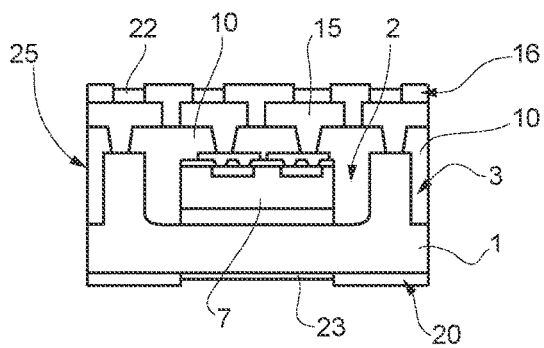

Hereinafter, FIG. 9, the conductive base 1 is cut along scribe lines passing through the protective layer 10 arranged in the separation cavity 3, forming single packaged devices 25 (one shown). For example, in FIG. 9, the packaged device 25 comprises a single die 7 arranged in an own accommodation cavity 2.

Figure 10:
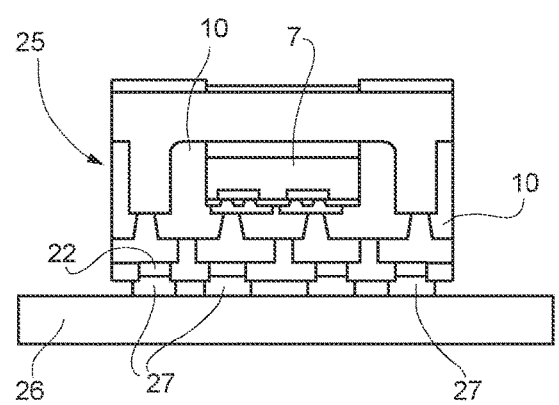
Figure 11:
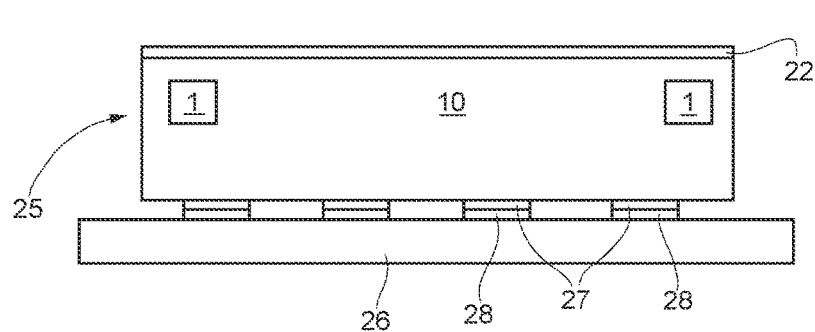
FIG. 11 is a lateral view of the comparative example device of FIG. 10.
Figure 12:
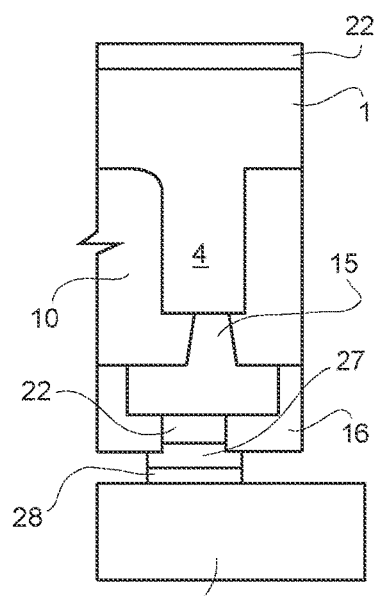
FIG. 12 is an enlarged scale cross-section, similar to FIGS. 1-10, of a portion of the comparative example device of FIG. 10.

In FIG. 10, the packaged device 25 is flipped over and bonded to a board 26, for example of a printed circuit, through solder zones 27 of conductive material, such as solder, applied at the top outer pads 22 and soldered to contacts 28 formed on the board 26 (see also the lateral view of FIG. 11 and the enlarged cross-section of FIG. 12).

Returning to FIG. 10, the bottom outer pad 23 remains here exposed and may be used for the electrical connection of the conductive base 1, in a not-shown manner.

The package shown in FIGS. 11 and 12 provides good protection and high dissipation, but may be improved.

In fact, it does not allow a simple inspection of the solder zones 27 which electrically connect the front outer pads 23 to the board 26, since they are arranged hidden under the device 25, as may be seen from FIGS. 11 and 12. Consequently, their integrity may not be ensured, reducing the Board Level Reliability (BLR).

On the other hand, more and more applications, such as automotive, have high reliability and quality requirements, which are not obtainable with the described packaging.

Figure 13:
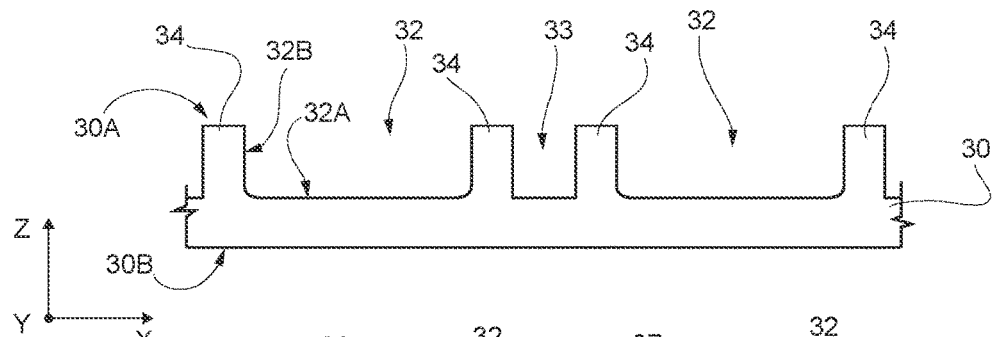
FIGS. 13-21 are cross-sections of the present device during successive steps of the present packaging method, according to an embodiment.

FIG. 13 shows a carrying base 30, typically of metal, such as copper or other metal or alloy, having a top surface 30A and a bottom surface 30B.

The top surface 30A is shaped and has a plurality of accommodation cavities 32, surrounded by a separation cavity 33.

The separation cavity 33 has, for example, a grid shape and extends along first lines passing through the drawing plane (parallel to a first axis Y of a Cartesian reference system XYZ) and along second lines parallel to a second axis X of the Cartesian reference system XYZ.

The accommodation cavities 32 may have a substantially parallelepiped, cubic, generally polyhedral or even cylindrical shape, provided with a bottom surface 32A connected to side walls 32B. The side walls 32B are formed by projections 34 of the carrying base 30.

The carrying base 30 may be formed, for example, from a metal band, which is processed to remove the metal in the cavities 32 and 33.

Figure 14:
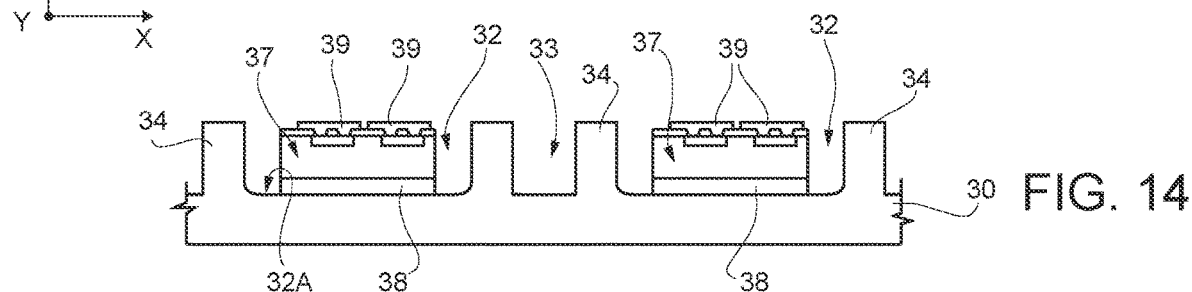

With reference to FIG. 14, dice 37 are bonded to the accommodation cavities 32 through conductive adhesive regions 38, for example of a conductive gel or an epoxy layer.

The dice 37 may integrate single power components or integrated circuits including power components, processing components and electrical connections, schematically shown in the figures and connected to the outside through die pads 39 arranged on the front side of the dice 37.

The dice 37 are bonded to the bottom surface 32A of the respective accommodation cavity 32 with their back side.

Figure 15:
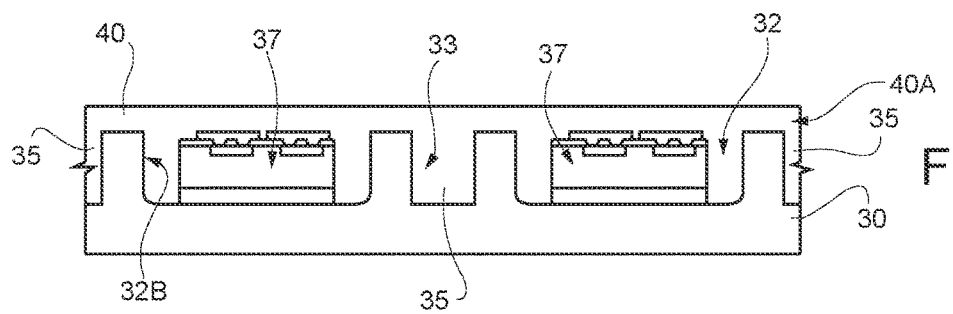

Subsequently, FIG. 15, a protective layer 40 is deposited on the carrying base 30 and on the dice 37, for example by using a lamination technique. The protective layer 40 is, for example, of polyamide (so-called prepeg). The protective layer 40 is deposited in a fluid state so as to penetrate into the accommodation cavities 32, between the side walls 2B and the dice 37, as well as within the separation cavity 33 (where it forms a filling portion 35 having the grid shape of the separation cavity 33). The protective layer 40 also completely covers the dice 37 with a covering portion 40A extending above the accommodation cavities 32A and the filling portion 35.

The covering portion 40A of the protective layer 40 may have a thickness comprised between 100 and 150 μm.

Figure 16:
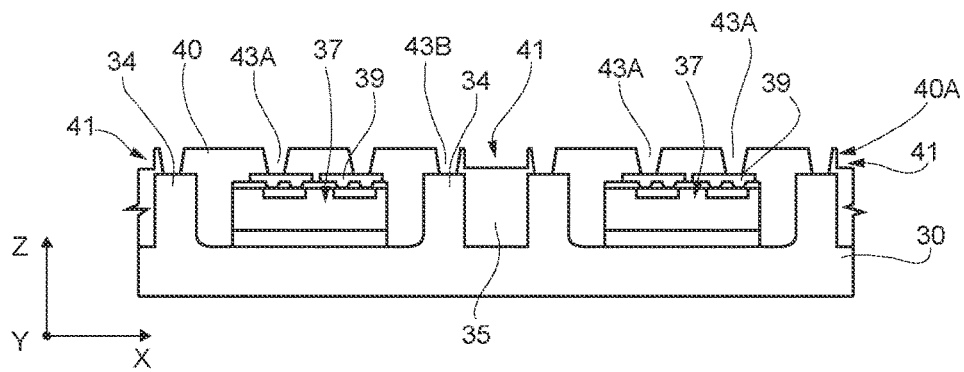

In FIG. 16, first and second vias 43A, 43B are formed through the covering portion 40A of the protective layer 40, for example by laser drill, possibly after covering the protective layer 40 through a thin anti-reflective layer (not shown), for example of copper. The first vias 43A extend along the whole thickness of the covering portion 40A of the protective layer 10 up to the die pads 39, which are thus exposed; the second vias 43B extend on the projections 34 of the carrying base 30.

Furthermore, grooves 41 are formed in the filling portion 35 of the separation cavity 33. The grooves 41 may have depths equal to the vias 43A, 43B (as shown in FIG. 16) or different depth, typically greater, up to half the thickness of the carrying base 30 or even more if desired. For example, according to the package type, they may have depths of at least 100 μm, typically 150-200 μm, but they may reach 350 μm in the case of 700 μm-thick packages. However, they may also have a smaller thickness, e.g., 75-95 μm, in the case of standard MLP/QFN packages.

The grooves 41 also have a minimum width of 100 μm or, in any case, so that they may be coated in the successive plating step, as described hereinafter with reference to FIG. 17, without being filled.

Figure 22:
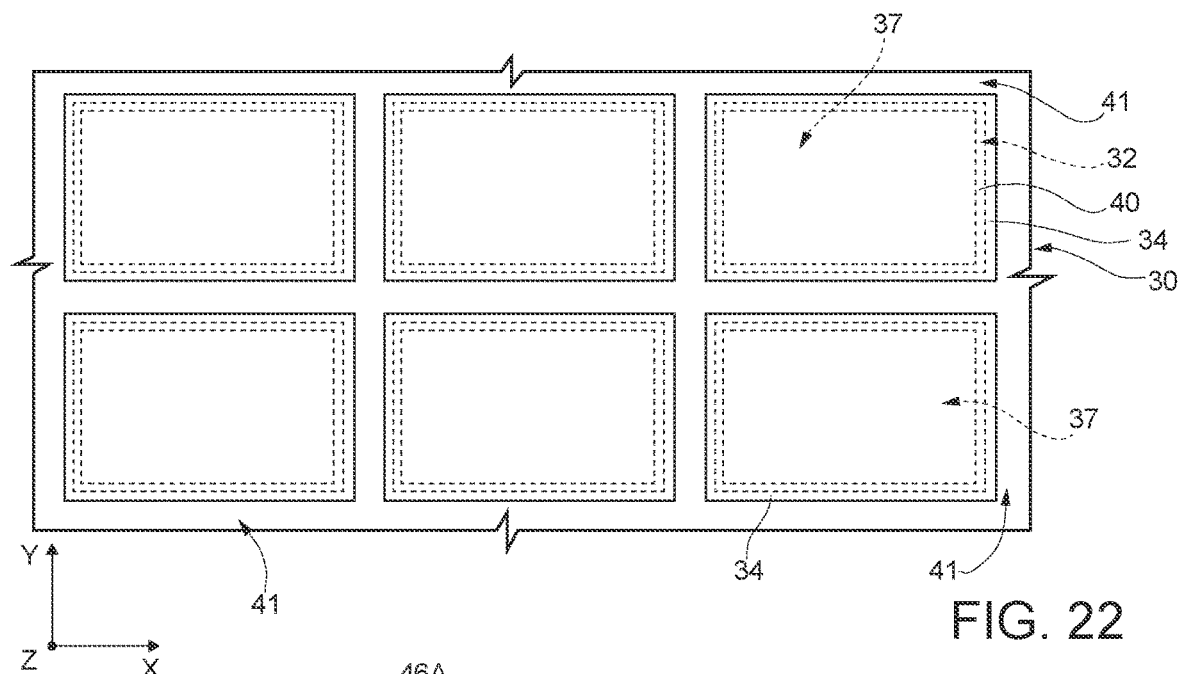
FIG. 22 is a top view of the intermediate structure of FIG. 14.

The grooves 41 may be formed by laser ablation, by blade/saw surface cutting, by shallow dicing or even by etching, in predetermined positions, at the vias 43A, 43B (hereinafter generically referred to as vias 43, if it is not necessary to distinguish them) or along the lines of the separation cavity 33, as shown in FIG. 22 (practically forming a single grid-shaped groove).

When the grooves 41 are formed by laser ablation or etching, they may be formed simultaneously with the vias 43.

The grooves 41 may have vertical walls, in particular when formed by blade/saw cutting, or slightly inclined walls (2-3°), if formed by laser ablation.

If the grooves 41 are formed by blade/saw cutting, they have non-perfectly smooth walls, which may be useful in helping sticking in the successive plating step (as described hereinafter with reference to FIG. 17).

Figure 17:
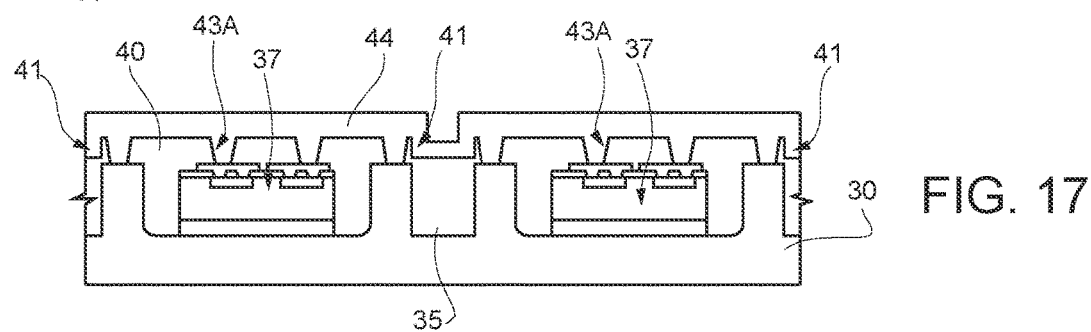

In FIG. 17, a conductive layer 44 is formed on the protective layer 40 and fills the vias 43. The conductive layer 44 also coats the bottom and flanks of the grooves 41. The conductive layer 44 may be of copper or an alloy thereof and have a thickness of 35-70 μm, also according to the width of the grooves 41, and may be galvanically deposited (copper plating).

Figure 18:
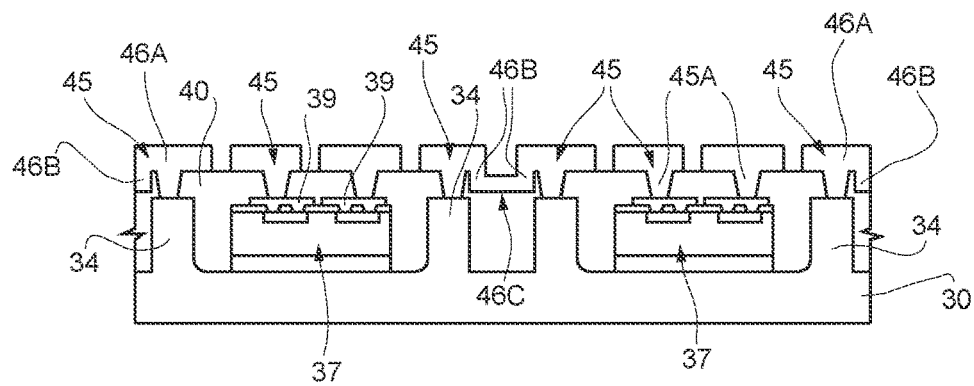

In FIG. 18, the conductive layer 44 is defined or patterned, for example by etching, to form connection regions 45 for the electrical connection of the die pads 39 and of the carrying base 30.

Each connection region 45 has a connecting portion 45A extending in a respective via 43; a surface portion 46A, extending above the protective layer 40, and a vertical portion 46B, extending on the flank of the adjacent groove 41.

Figure 19:
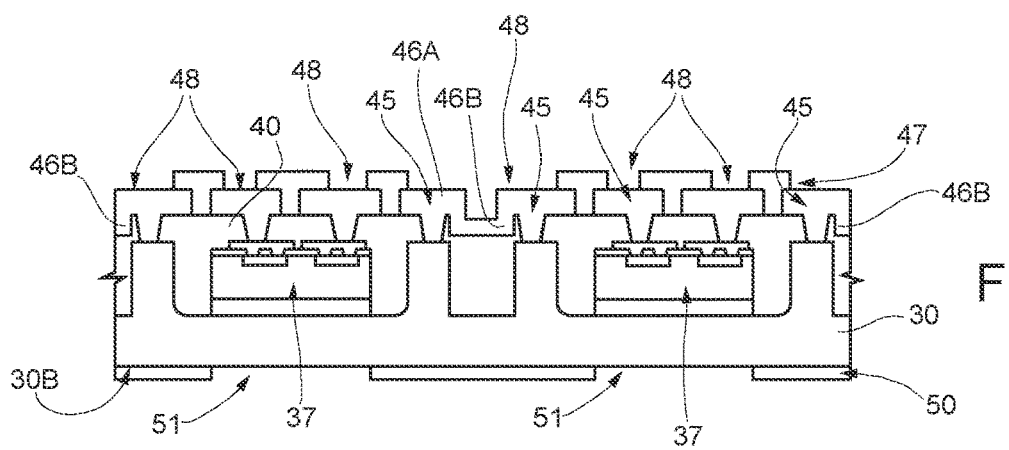

In FIG. 19, a first insulating layer 47, for example an alloy or an insulating solder, is formed above the intermediate structure of FIG. 18. The first insulating layer 47 is then patterned, so as to have first openings 48 at the connection regions 45.

Furthermore, a second insulating layer 50 is formed and patterned on the bottom surface 30B of the carrying base 30. The second insulating layer 50 has second openings 51, for example one for each die 37, underlying the respective die 37.

In general, the first and the second insulating layers 47, 50 are of the same material and may be deposited and patterned in two different steps.

Figure 20:
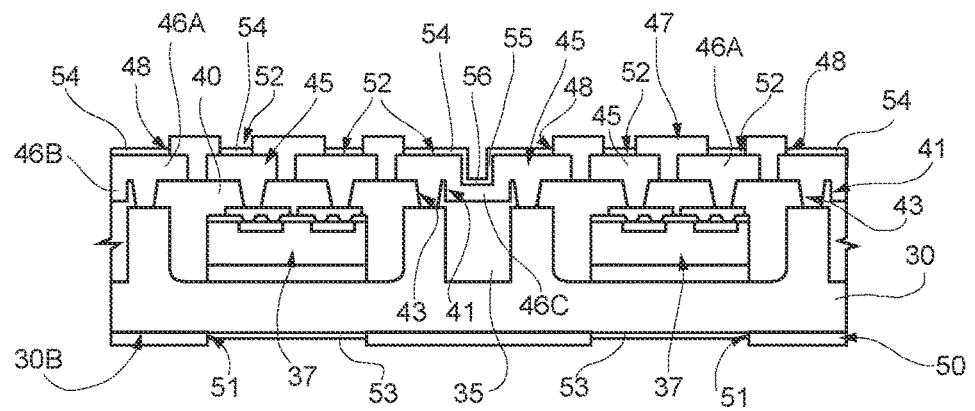

In FIG. 20, front outer connections are formed in the first openings 48 of the first insulating layer 50, on the connection regions 45; and back outer connections 53 are formed in the second openings 51 on the bottom surface 30B of the carrying base 30. The back outer connections 53 also form thermal dissipation surfaces.

In particular, in FIG. 20, the front outer connections 52 have top portions 54 extending on the front side of the dice 37, directly on the surface portions 46A of the connection regions 45; side portions 55 extending on the vertical portions 46B of the connection regions 45; and bottom portions 56 extending on the bottom sections 46C of the connection regions 45.

The outer connections 52 and 53 are of high electrical conductivity material and are, for example, formed through ENIG (Electroless Nickel Immersion Gold) process, that is by galvanic growth of nickel and formation of a thin gold layer obtained by immersion.

Figure 23:
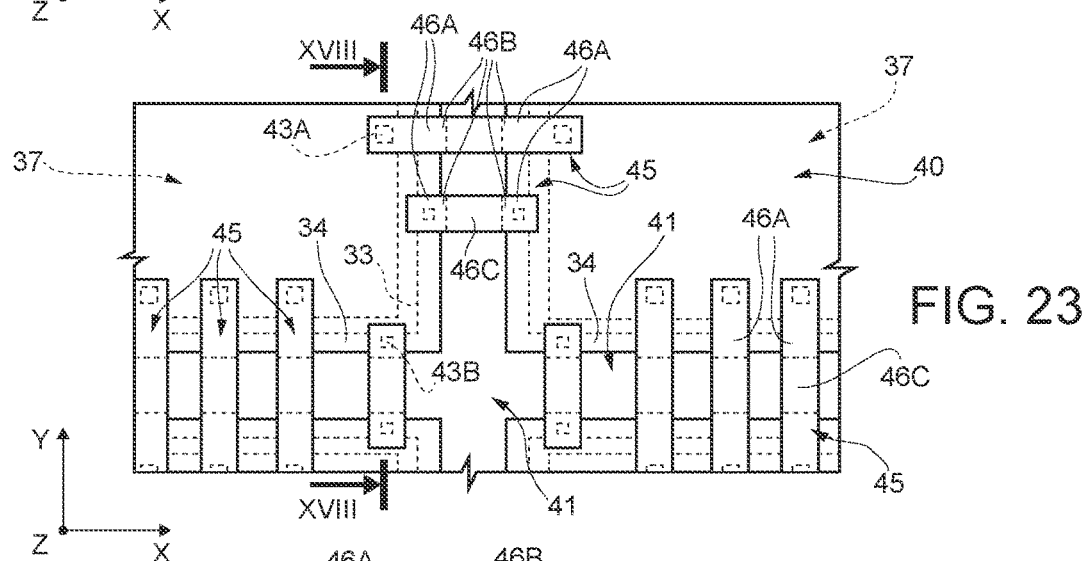
FIGS. 23 and 24 show top views of portions of the intermediate structure of FIG. 20, according to two different embodiments.

In this step, the vertical portions 46B and the side portions 55, facing each other, of two different dice 37, may still be connected to each other through the bottom sections 46C and the bottom portions 56 at the bottom of the groove 41 (e.g., as shown in FIG. 23) and are subsequently separated during the cutting step, as explained hereinafter.

Figure 24:
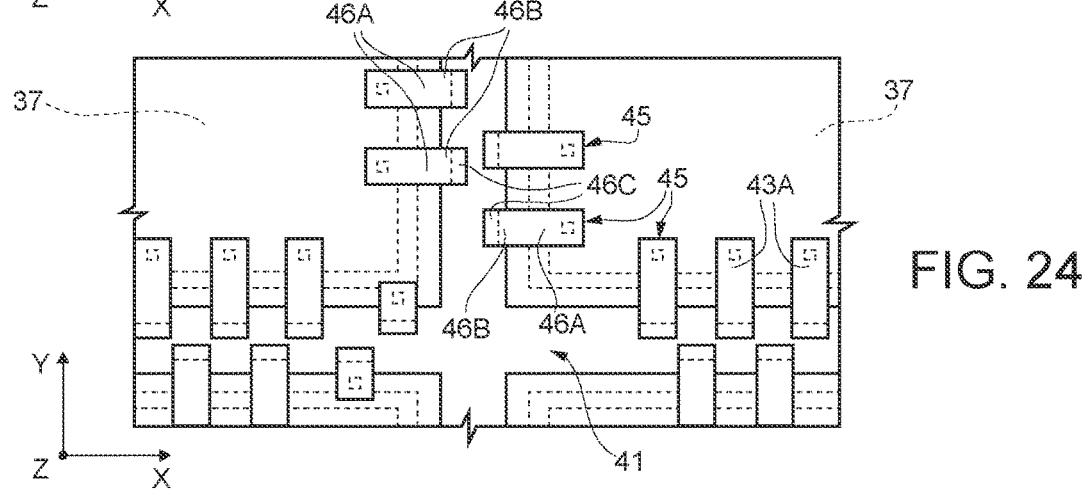

Alternatively, as shown in FIG. 24, the vertical portions 46B and the side portions 55, facing each other, of different dice 37, may be separated from each other, with smaller bottom sections 46C and bottom portions 56 that are not connected in pairs.

Figure 21:
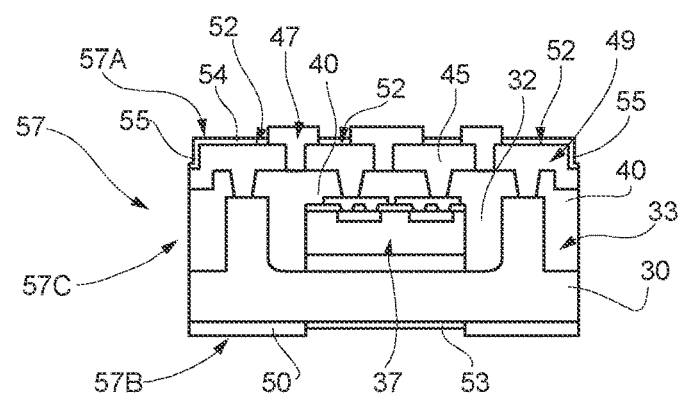

Hereinafter, FIG. 21, the intermediate structure of FIG. 20 is cut along scribe lines passing through the filling portions 35 of the protective layer 40, forming single packaged devices 57 (one shown). For example, in FIG. 21, the packaged device 57 comprises a single die 37 arranged in an own accommodation cavity 32.

In practice, the scribe lines pass through the bottom portions 56 of the front outer pads 52, removing them almost completely and the side portions 55 of the front outer connections 52 are exposed along the side of the packaged device 57.

Following the cut, each packaged device 57 has a front surface 57A, a back surface 57B, opposite to the front surface, and a side surface 57C extending between the front surface and the back surface.

In this manner, after cutting, the connection regions 45 and the front outer connections 52 form I/O terminals 49 of the packaged devices 57. In particular, the I/O terminals 49 are formed by first connection portions in the vias 43, in electrical contact with the die pads 39 (formed by the connecting portions 45A of the connection regions 45); by second connection portions, comprising the vertical portions 46B of the connection regions 45 and the side portions 55 of the front outer connections 52 extending above the protective layer 40, along the side surface 57C of the packaged device 57; and by third connection portions, comprising the surface portions 46A of the connection regions 45 and the top portions 54 of the front outer connections 52, extending above the protective layer 40, along the front surface 57A of the packaged device 57.

Figure 27:
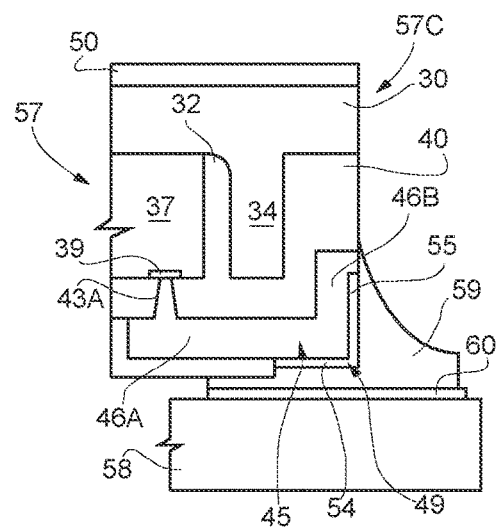
FIG. 27 shows a variation of the cross-section of FIG. 26.

Remarkably, the shape of the surface portions 46A of the connection regions 45 and the top portions 54 of the front outer connections 52 is designed to electrically connect the die pads 39 and the projections 34 according to the desired configuration, in a manner that is obvious to a person skilled in the art. For example, FIG. 27 shows an embodiment where the front outer connections 52 do not extend above the first vias 43A.

Figure 25:
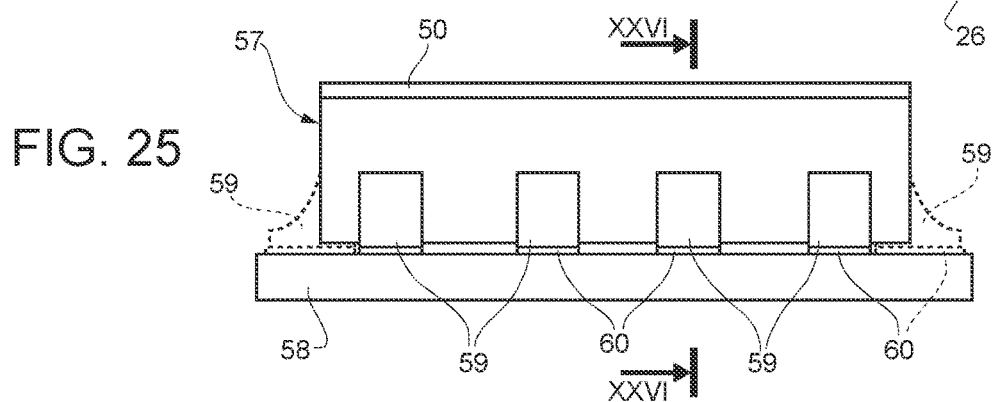
FIG. 25 is a lateral view of the present packaged device, after soldering to a board.

Then, FIG. 25, the packaged device 57 is flipped over and bonded to a board 58, for example of a printed circuit. To this end, the board 58 has contacts 60 arranged at the I/O terminals 49 and precisely at the top portions 54 of the front outer connections 52; and solder regions 59 of conductive material, e.g., solder, have been previously applied to the contacts 60 on the board 58 or to the I/O terminals 49. The solder regions 59 may be applied by screen printing and heat treatment, according to techniques known to the person skilled in the art.

Figure 26:
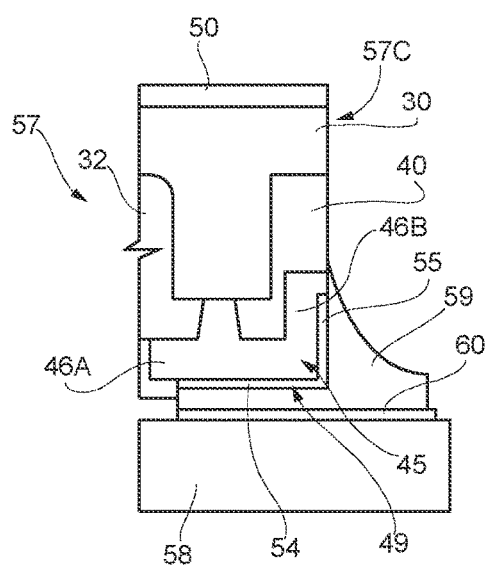
FIG. 26 is an enlarged scale cross-section of a portion of the device of FIG. 25, taken along section line XXVI-XXVI of FIG. 25.

In particular, as visible in the cross-section of FIG. 26, in the packaged device 57 the solder regions 59 may adhere both to the top portions 54 and to the side portions 55 of the front outer connections 52.

Consequently, the packaged device 57 has a wettable flank package, as desired in some applications wherein high Board Level Reliability (BLR) of the soldering is desired, for example in the automotive field.

In fact, in this manner, the solder area considerably increases; furthermore, the side portions 55 of the front outer connections 52 are optically inspectable in a simple manner, both by human operators and automatically, allowing the solder integrity to be easily verified (reliable and inspectable meniscus).

These advantages are all the more evident as deeper are the grooves 41 and thus the greater is the height of the side portions 55 of the front outer connections 52 (and of the respective underlying vertical portions 46B of the connection regions 45) which, as said, may reach half the thickness of the carrying base 30 (as a first approximation, equal to the thickness of the packaged device 57).

Furthermore, the packaged device 57 thus obtained has comparable and only slightly higher manufacturing costs with respect to known devices, since it includes only one additional operating step, for forming the grooves 41.

Finally, it is clear that modifications and variations may be made to the packaged device and to the manufacturing method described and illustrated herein without thereby departing from the scope of the present disclosure, as defined in the attached claims.

For example, each accommodation cavity 32 may contain more than one die 37.

A packaged device (57) having a front surface (57A), a back surface (57B), opposite to the front surface, and a side surface (57C) extending between the front surface and the back surface, may be summarized as including: a carrying base (30); an accommodation cavity (32) in the carrying base; a semiconductor die (37) in the accommodation cavity (32), the semiconductor die having die pads (39); a protective layer (40), covering the semiconductor die and the carrying base; first vias (43A) in the protective layer, at the die pads (39); and connection terminals (49) of conductive material, the connection terminals having first connection portions (45A) in the first vias (43A), in electrical contact with the die pads (39), and second connection portions (46B, 55), extending on the protective layer (40), along the side surface (57C) of the packaged device.

The carrying base (30) may be of conductive material and may have delimitation walls (34) of the accommodation cavity (32), the device comprising second vias (43B) extending in the protective layer (40) at the delimitation walls (34) of the carrying base (30) and base connection terminals (49) having first base connection portions (45A) extending in the second vias, in electrical contact with the carrying base, and second base connection portions (46A, 46B, 54, 55), extending above the protective layer (40) and along the side surface (57C) of the packaged device (57).

The front surface (57A) and the back surface (57B) of the packaged device (57) may be arranged at a distance along a device height direction and the second connection portions (54, 55) of the connection terminals (49) may have a length, in the height direction, lower than the distance between the front surface (57A) and the back surface (57B) of the packaged device.

The carrying base (30) may have a height in the device height direction, and the second connection portions (54, 55) of the connection terminals (49) may have, in the device height direction, a length equal to half the height of the carrying base (30). The connection terminals (49) may include third connection portions (46A, 54) extending above the protective layer (40), along the front surface (57A) of the packaged device (57), between the first and the second connection portions.

The first connection portions (45A) of the connection terminals (49) may be of a first material; the second connection portions (46B, 55) of the connection terminals may include vertical portions (46B) of the first material, extending adjacent to the side surface (57C) of the packaged device (57), and side portions (55) of a second material, extending above the vertical portions (46B), along the side surface of the packaged device; and the third connection portions (46A, 54) of the connection terminals may include surface portions (46A), of the first material, extending above the protective layer (40) between the first connection portions (45A) and the vertical portions (46B), and top portions (54), of the second material, extending above the surface portions (46A).

A first insulating layer (47) may extend between and partially above the surface portions (46A) and may have openings (48) wherein the top portions (54) of the connection terminals (49) extend.

An electronic device may be summarized as including: the packaged device (57); a support (58) having conductive contact regions (60) facing the first connection portions (45A) of the connection terminals; and adhesive regions (59) between the conductive contact regions (60) and the front surface (57A) of the device, in electrical contact with the connection terminals (49), the adhesive regions (59) further extending along the side surface (57C) of the packaged device, in contact with the second connection portions (46B), (55) of the connection terminals.

A method for manufacturing a packaged device may be summarized as including the steps of: forming a carrying base (30) having a plurality of accommodation cavities (32) surrounded by delimitation walls accommodating a separation cavity (33); bonding a plurality of semiconductor dice (37) into the accommodation cavities (32), the semiconductor dice having die pads (39); forming a protective layer (40) above the semiconductor dice and the carrying base, the protective layer extending in the accommodation cavities (32) around the semiconductor dice and in the separation cavity (33); forming first vias (43A) in the protective layer (40) at the die pads (39); forming grooves (41) in the protective layer (40), above the separation cavity (33); forming connection terminals of conductive material, the connection terminals having first connection portions (45A) in the first vias (43A), in electrical contact with the dice (37), and second connection portions (46B, 55) in the grooves; and cutting the carrying base and the protective layer (40) at the grooves (41) thereby separating a plurality of packaged devices (57), each packaged device having a side surface (57C), and exposing the second connection portions (46B, 55) along the side surface of each packaged device.

Forming connection terminals (49) may include: depositing a conductive layer (44) of a first conductive material on the protective layer, thereby forming the first connection portions (45A) in the first vias, the vertical portions (46B) in the grooves, surface portions (46A) between the first connection portions (45A) and the vertical portions (46B), as well as bottom sections (46C) on bottom surfaces of the grooves (41); forming insulating regions (47) between and partially above the surface portions (46A), the insulating regions (47) having openings (48); and forming outer connection regions of a second conductive material in the openings (48), the outer connection regions comprising top portions (54) on the surface portions (46A), side portions (55) on the vertical portions (46B) and bottom portions (56) on the bottom sections (46C).

Cutting the carrying base (30) and the protective layer (40) may include removing the bottom sections (46C) of the conductive layer (44) and the bottom portions (56).

The carrying base (30) may have a height and the grooves (41) may have a maximum depth equal to half the height of the carrying base.

The carrying base (30) may be of conductive material, the method may further include: forming second vias in the protective layer (40) at the delimitation walls (34) of the carrying base; and forming base connection terminals (49), of conductive material, within the second vias (43B) and in the grooves (41), above the protective layer (40), wherein cutting the carrying base (30) and the protective layer (40) may include exposing the base connection terminals along the side surface (57C) of each packaged device (57).

Forming the grooves (41) may include laser ablation, or blade/saw cutting or etching.

The method for manufacturing an electronic device may include bonding the packaged device (57) to a support (58) having conductive contact regions (60), wherein bonding may include applying adhesive regions (59) between the conductive contact regions (60) and the first connection portions (45A) and on a side surface of the packaged device (57), in contact with the second connection portions (46B), (55) of the connection terminals (49).

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A packaged device, comprising:
a front surface, a back surface opposite to the front surface, and one or more side surfaces extending between the front surface and the back surface;
a carrying base including delimitation walls and including one or more first sidewalls partially defining the one or more side surfaces;
an accommodation cavity in the carrying base and delimited by the delimitation walls;
a semiconductor die in the accommodation cavity;
a protective layer covering the semiconductor die and the carrying base, the protective layer including protrusions on the delimitation walls, the protective layer including one or more second sidewalls partially defining the one or more side surfaces, the one or more second sidewalls are coplanar with the one or more first sidewalls;
first via grooves in the protective layer, the first via grooves extend to the delimitation walls, and the first via grooves are at least partially delimited by the protrusions; and
side connection grooves are on opposite sides of the protrusions relative to the first via grooves, the side connection grooves extend from the protrusions to the one or more side surfaces;
first connection terminals of conductive material, the first connection terminals having first connection portions in the first via grooves in electrical contact with the delimitation walls, second connection portions extending on the protective layer and coupled to the first connection portions, and third connection portions extending along the one or more side surfaces and coupled to the second connection portions, the third portions of the first connection terminals of conductive material include one or more third sidewalls defining the one or more sidewalls, the one or more third sidewalls are coplanar with the one or more first sidewalls and the one or more second sidewalls; and
conductive outer connection layers on the second connection portions and the third connection portions of the first connection terminals of conductive material, the conductive outer connection layers including one or more end surfaces coplanar with the one or more first sidewalls, the one or more end surfaces partially define the one or more side surfaces, and the one or more end surfaces coplanar with the one or more first sidewalls, the one or more second sidewalls, and the one or more third sidewalls.

2. The packaged device according to claim 1, further comprising second via grooves extending in the protective layer, the second via grooves overlapping die pads of the semiconductor die, and second connection terminals having first connection portions in the second via grooves and second connection portions coupled to the first connection portions and extending on the protective layer.

3. The packaged device according to claim 1, wherein the front surface and the back surface are arranged at a distance along a first direction and the second connection portions of the connection terminals have a length, in the first direction, less than the distance between the front surface and the back surface.

4. The packaged device according to claim 3, wherein the carrying base has a height in the first direction, and the second connection portions of the connection terminals have, in the first direction, a length equal to half the height of the carrying base.

5. The packaged device according to claim 1, further comprising:
second via grooves in the protective layer, the second via grooves extend to die pads of the die; and
second connection terminals of conductive material including fourth connection portions in the second via grooves and fifth connection portions coupled to the fourth connection portions, the fifth connection portions extend above the protective layer, extend along the front surface, and are between at least a pair of the first connection terminals of conductive material.

6. The packaged device according to claim 1, wherein:
the first connection portions of the connection terminals are of a first material;
the third connection portions of the connection terminals comprise vertical portions of the first material;
the second connection portions of the connection terminals comprise surface portions of the first material, extending above the protective layer between the first connection portions and the vertical portions; and
the conductive outer connection layers on the second connection portions and the third connection portions are on the vertical portions and the surface portions, and the conductive outer connection layer is made of a second material.

7. The packaged device according to claim 6, wherein a first insulating layer extends between and partially above the surface portions and has openings exposing the conductive outer connection layers.

8. An electronic device, comprising:
a packaged device including:
a front surface, a back surface opposite to the front surface, and one or more side surfaces extending between the front surface and the back surface;
a carrying base including delimitation walls;
an accommodation cavity in the carrying base and delimited by the delimitation walls;
a semiconductor die in the accommodation cavity, the semiconductor die having die pads;

a protective layer covering the semiconductor die and the carrying base, the protective layer including protrusions on the delimitation walls;
first via grooves in the protective layer, the first via grooves overlap and extend to the die pads; and
second via grooves in the protective layer spaced outward from the first via grooves, the second via grooves extend to the delimitation walls;
side connection grooves are on opposite sides of the protrusions relative to the second via grooves, the side connection grooves extend from the protrusions to the one or more side surfaces;
first connection terminals of conductive material, the first connection terminals having first connection portions in the first via grooves and in electrical contact with the die pads, and second connection portions extending on the protective layer;
second connection terminals of conductive material, the second connection terminals having third connection portions in the second via grooves and in electrical contact with the delimitations walls, fourth connection portions within the side connection grooves and exposed at the one or more side surfaces, and fifth connection portions extending on the protective layer from the first connection portions to the second connection portions, respectively;
a support having conductive contact regions facing the first connection terminals and the second connection terminals; and
adhesive regions between the conductive contact regions and the front surface, the adhesive regions are in electrical contact with the conductive contact regions, the first connection terminals, and the second connection terminals, and the adhesive regions further extending along the one or more side surfaces and in contact with the fourth connection portions of the second connection terminals.

9. The electronic device of claim 8, wherein:
the delimitation walls further include ends at which the delimitation walls terminate; and
the fourth connection portions of the second connection terminals extend into the protective layer and past the ends of the delimitation walls.

10. The electronic device of claim 8, wherein the front surface and the back surface are arranged at a distance along a first direction and the fourth connection portions of the second connection terminals have a length, in the first direction, less than the distance between the front surface and the back surface.

11. The packaged device according to claim 10, wherein the carrying base has a height in the first direction, and the fourth connection portions of the second connection terminals have, in the first direction, a length equal to half the height of the carrying base.

12. The packaged device according to claim 8, wherein the protrusions are delimited by the delimitation walls, the side connection grooves, the fourth connection portions, and the fifth connection portions.

13. The package device according to claim 12, wherein:
the first connection portions of the connection terminals are of a first material;
the second connection portions of the connection terminals comprise vertical portions of the first material, extending adjacent to the side surface, and side portions of a second material, extending above the vertical portions, along the side surface; and
the third connection portions of the connection terminals comprise surface portions, of the first material, extending above the protective layer between the first connection portions and the vertical portions, and top portions, of the second material, extending above the surface portions.

14. A packaged device, comprising:
a first surface, a second surface opposite to the first surface, a first side surface extending between the first surface and the second surface, and a second side surface extending between the first surface and the second surface, the second side surface being opposite to the first side surface, and the first and second side surfaces being transverse to the first surface and transverse to the second surface;
a carrying base including:
an accommodation cavity within the carrying base;
a first projection on a first side of the accommodation cavity, the first projection at least partially delimits the accommodation cavity;
a second projection on a second side of the accommodation cavity opposite to the first side of the accommodation cavity, the second projection at least partially delimits the accommodation cavity; and
a first external sidewall and a second external sidewall opposite to the first external sidewall;
a semiconductor die in the accommodation cavity, the semiconductor die including at least one die pad, the semiconductor die fills a first portion of the accommodation cavity;
a protective layer covers the projections of the carrying base, covers the semiconductor die, and fills a second portion of the accommodation cavity, the protective layer further includes:
a first protrusion on the first projection that delimits a first via groove in the protective layer that overlaps the first projection, and a first connection groove on an opposite side of the first protrusion relative to the first via groove, the first connection groove extends from the first protrusion to the side surface;
a second protrusion on the second projection that delimits a second via groove in the protective layer, the second via groove overlaps the second projection, and a second connection groove on an opposite side of the second protrusion relative to the second via groove, the second connection groove extends from the second protrusion to the side surface;
a third via groove extends to the at least one die pad; and
a third external sidewall and fourth external sidewall opposite to the third external sidewall, the third external sidewall is coplanar with the first external sidewall, and the fourth external sidewall is coplanar with the second external sidewall;
a first connection region having a first via extending through the protective layer to the first projection, the first via coupled to the first projection, and the first via within the first via groove, the first connection region including a first vertical portion within the first connection groove and a first surface portion that extends along the protective layer from the first via to the first vertical portion;
a second connection region having a second via extending through the protective layer to the second projection, the second via coupled to the second projection, and the second via within the second via groove, the second connection region including a second vertical portion within the second connection groove and a second surface portion that extends along the protective layer from the second via to the second vertical portion;

a third connection region having a third via extending through the protective layer to the at least one die pad, the third via coupled to the at least one die pad, and the third via within the third via groove, and the third connection region being between the first and second outer connection regions;

an insulating layer on the protective layer;

a first conductive outer connection layer on the first vertical portion and on the first surface portion, the first conductive outer connection layer having a first end surface coplanar with first sidewall and third sidewall, and the first conductive outer connection layer is exposed from the insulating layer; and a second conductive outer connection layer on the second vertical portion and on the second surface portion, the second conductive outer connection layer having a second end surface coplanar with second sidewall and the fourth sidewall, and the second conductive outer connection layer is exposed from the insulating layer.

15. The packaged device of claim 14, wherein:

the first conductive outer connection layer extends along the first surface portion and overlaps the first via; and the second conductive outer connection layer extends along the second surface portion and overlaps the second via.

16. The packaged device of claim 14, wherein:

the first conductive outer connection layer terminates along the first surface portion before overlapping the first via; and the second conductive outer connection layer terminates along the second surface portion before overlapping the second via.

17. The packaged device of claim 14, wherein:

the third connection region is spaced inward from the first connection region and the second connection region.

18. The packaged device of claim 14, wherein the first external sidewall of the carrying base, the third external sidewall of the protective layer, the first vertical portion of the first connection region at least partially define a first side surface, and the second external sidewall of the carrying base, the fourth external sidewall of the protective layer, the second vertical portion of the second connection region, and the second end surface of the second conductive outer connection layer at least partially define second side surface.

19. The packaged device of claim 17, wherein:

the third connection region includes a third surface portion that is coupled to the third via; and the insulating layer is on the third surface portion of the third connection region.

20. The packaged device of claim 19, further comprising:

a third conductive outer connection layer on the third surface portion and exposed from the insulating layer.

* * * * *